United States Patent [19]

Thornton, Jr. et al.

[11] Patent Number: 4,528,504
[45] Date of Patent: Jul. 9, 1985

[54] PULSED LINEAR INTEGRATED CIRCUIT TESTER

[75] Inventors: Max C. Thornton, Jr., Palm Bay; Paul Kuntz; Russell L. Meyer, both of Melbourne; Kenneth M. Rosier, Rockledge, all of Fla.

[73] Assignee: Harris Corporation, Melbourne, Fla.

[21] Appl. No.: 382,603

[22] Filed: May 27, 1982

[51] Int. Cl.³ .................... G01R 31/02; G01R 15/12
[52] U.S. Cl. .................... 324/158 F; 324/73 AT
[58] Field of Search .......... 324/158 F, 73 PC, 73 AT

[56] References Cited

U.S. PATENT DOCUMENTS

| | | | |
|---|---|---|---|
| 3,039,604 | 6/1962 | Bickel et al. | 324/73 AT |
| 3,363,179 | 1/1968 | McCutcheon | 324/158 F |
| 3,423,677 | 1/1969 | Alford et al. | 324/158 F |
| 3,461,386 | 8/1969 | McCutcheon et al. | 324/158 F |
| 3,496,464 | 2/1970 | Tankersley | 324/73 R |
| 3,676,777 | 7/1972 | Charters | 324/158 F |
| 3,710,251 | 1/1973 | Hagge et al. | 324/158 F |
| 3,842,346 | 10/1974 | Bobbitt | 324/73 R |
| 3,872,385 | 3/1975 | Koga et al. | 324/158 F |
| 3,979,671 | 9/1976 | Meeker et al. | 324/158 F |
| 4,044,244 | 8/1977 | Foreman et al. | 324/73 R |
| 4,045,735 | 8/1977 | Worcester et al. | 324/158 F |
| 4,055,801 | 10/1977 | Pike et al. | 324/73 R |
| 4,115,736 | 9/1978 | Tracy | 324/158 F |
| 4,168,527 | 9/1979 | Winkler et al. | 324/73 R |
| 4,172,993 | 10/1979 | Leach | 324/158 F |

Primary Examiner—Ernest F. Karlsen
Attorney, Agent, or Firm—Barnes & Thornburg

[57] ABSTRACT

The tester includes a test cabinet which forms an electromagnetic shield enclosure with an aperture in the top wall through which a device under test extends and a thermal hood intersecting the top wall to form a thermal and electromagnetic shield enclosure about the device under test. A device under test receptacle is mounted to a removable electromagnetic shield load board with coaxial connectors which snap into coaxial connectors on a electromagnetic shield mother board which is permanently mounted in the electromagnetic shielded enclosure. The connection of the terminals at the bottom of the mother board are by matched impedance, equal length coaxial cables to the A.C. interface and a ribbon cord to the D.C. interface. The environmental enclosure, the housing are grounded to frame ground and the load board and the mother board are all grounded to instrument ground which is then attached to frame ground via single ground point.

13 Claims, 9 Drawing Figures

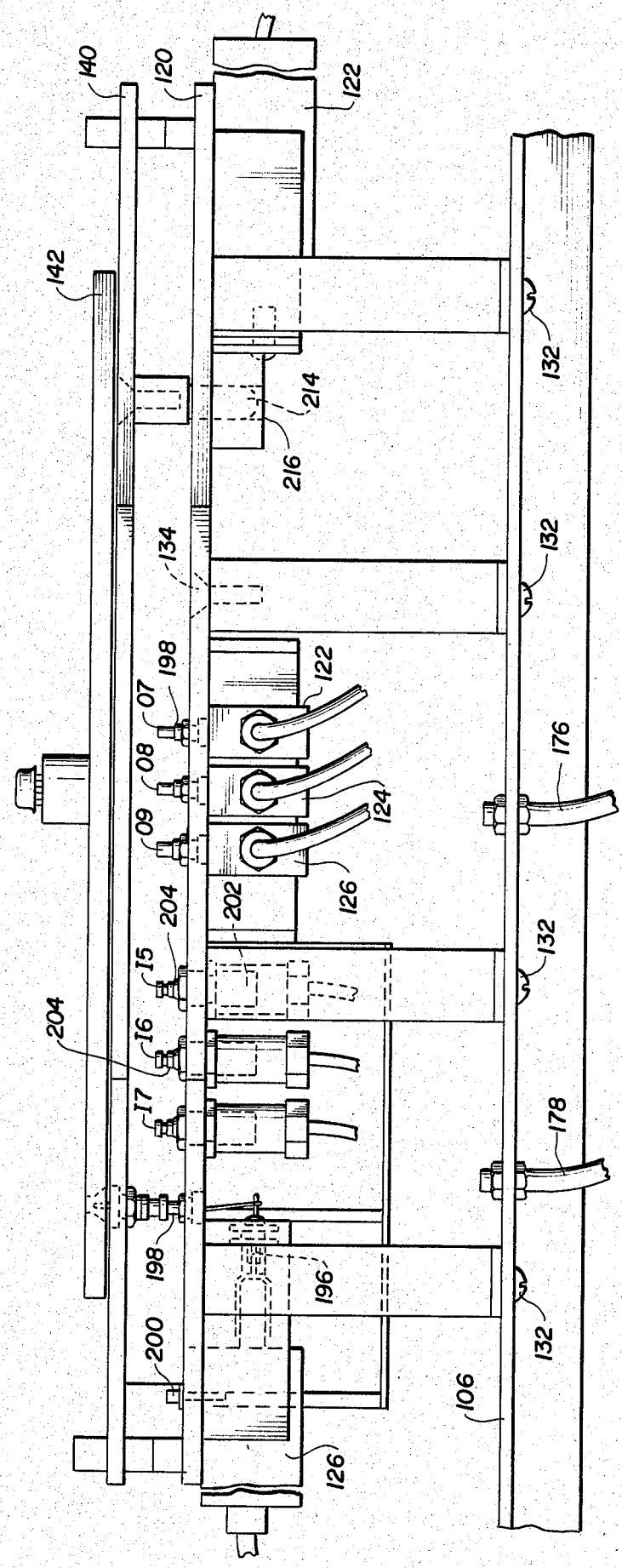

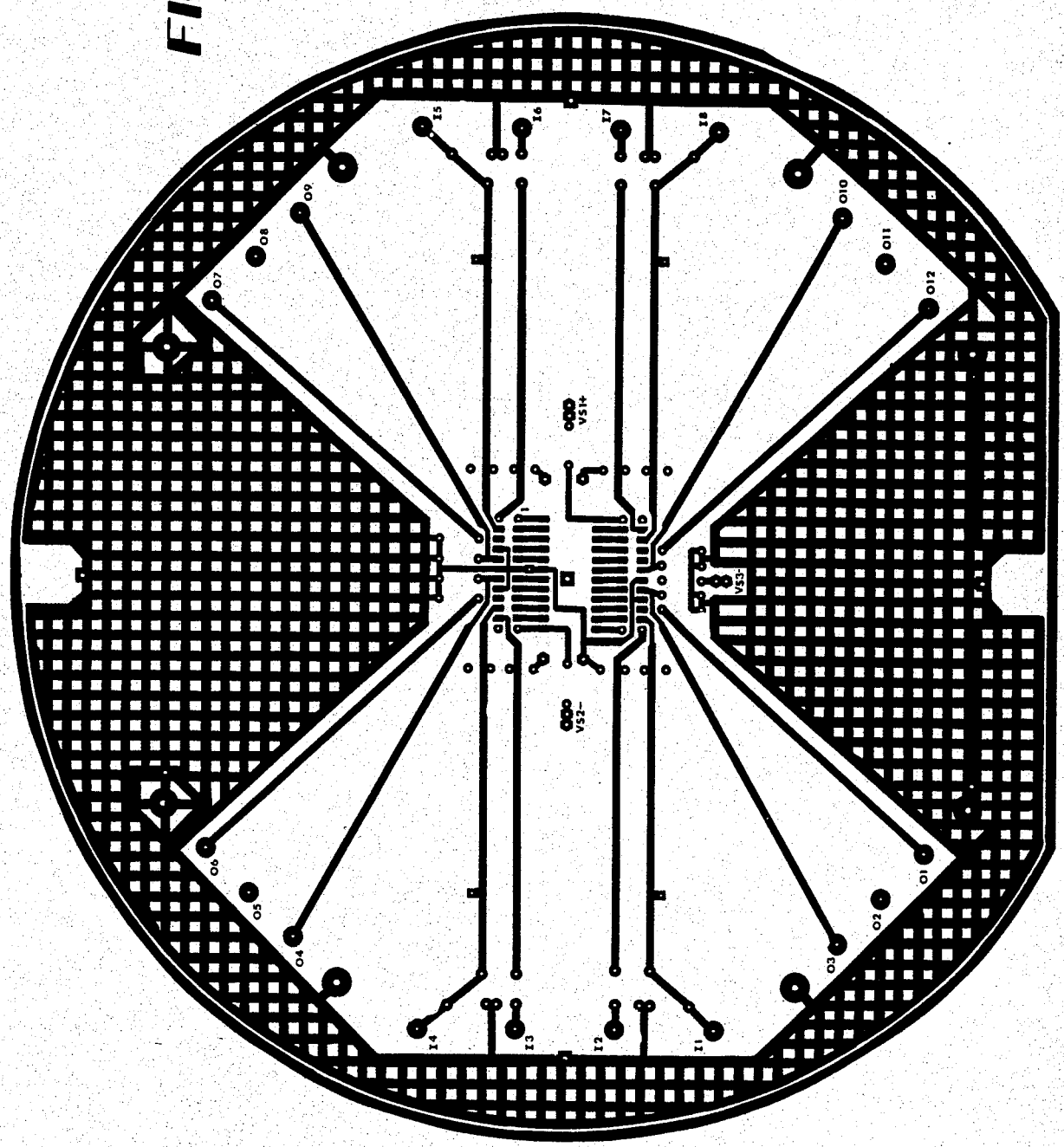

PULSED LINEAR INTEGRATED CIRCUIT TESTER

BACKGROUND OF THE INVENTION

The present invention relates generally to integrated circuit testers and, more specifically, to a pulse linear tester.

The prior art includes many systems for testing linear integrated circuits in their packages. These generally include sophisticated shielding enclosures, coaxial cables and environmental control systems. Prior art devices have been designed for ease of modification and insertion of uniquely designed elements for each device under test. Although the prior art devices have improved over the years, no device has been produced which is capable of measuring voltages in the 20 volt to less than 10 millivolt range. Commercially available linear integrated circuit testers test in the range of 10 volts down to 20 millivolts. Thus, there exists a need for a linear integrated circuit tester with inversed range of voltage measurements.

SUMMARY OF THE INVENTION

An object of the present invention is to provide a linear integrated circuit tester capable of measuring voltages in the 20 volt to less than 10 millivolt range.

Another object of the present invention is to provide a unique design of integrated circuit testing equipment to create a very low noise device under test environment.

A still further object of the present invention is to provide a tester for linear integrated circuit wherein the environmental control system does not deterioratively affect the printed circuit board which is specifically designed for the device under test.

A still even further object of the present invention is to provide an improved electromagnetically isolated environment for the device under test.

These and other objects of the present invention are attained by providing a test cabinet which forms an electromagnetic shield enclosure with an aperture in the top wall through which a device under test extends and a thermal hood intersecting the top wall to form a thermal and electromagnetic shield enclosure about the device under test. The device under test is inserted into a device receptacle which is mounted to a removable test board specifically designed for that device under test which snaps into a mother board which is permanently mounted in the electromagnetic shielded enclosure. The test board includes a printed circuit board mounted directly to a rigid electromagnetic shield plate having coaxial connectors on the bottom thereof which snap onto coaxial connectors extending above the mother board which is also formed from an electromagnetic shield plate. The connection of the terminals at the bottom of the mother board are by coaxial cables to the A.C. interface and a ribbon cord to the D.C. interface. By using impedance matched coaxial cables and equal length cables, close impedance match between the lines and the low noise environment is achieved. The environmental enclosure, the housing, the load board and the mother board are all grounded.

Other objects, advantages and novel features of the present invention will become evident from the detailed description of the preferred embodiment in conjunction with the accompanying drawings.

BRIEF DESCRIPTION OF THE DRAWINGS

FIG. 8 is a cutaway side view of another angle of the test of FIG. 7.

FIG. 9 is a plan view of a printed circuit board for use with the present invention.

DETAILED DESCRIPTION OF THE PREFERRED EMBODIMENT

Figure 1:
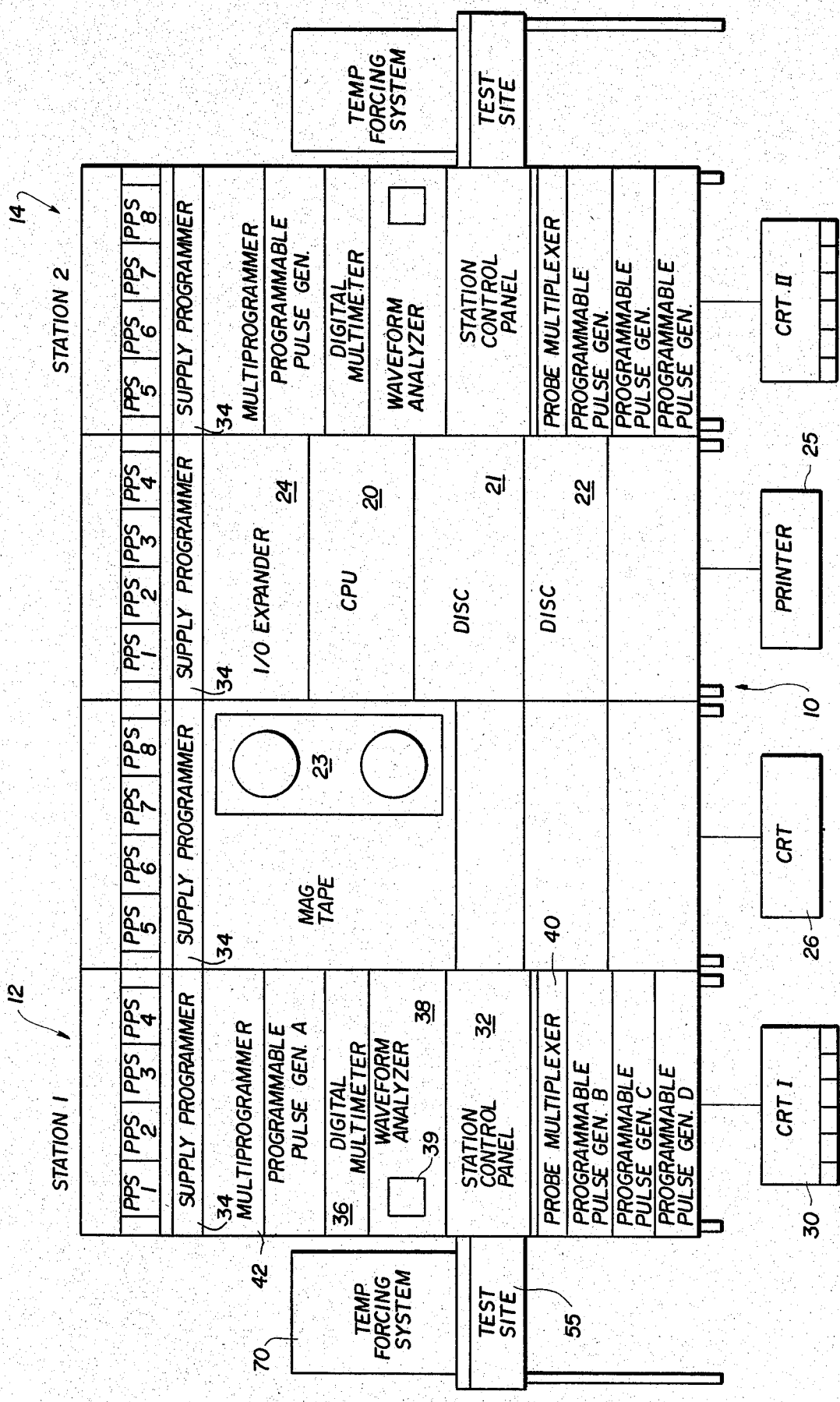
FIG. 1 is a front view of a pulsed linear integrated circuit tester incorporating the principles of the present invention.

The pulsed linear tester of the present invention is illustrated in FIG. 1, as including a central computer section 10 and a pair of test stations 12 and 14 sharing the central computer 10. The central computer 10 includes a CPU 20 with a pair of disc drives 20 and 21, magnetic tape drive 23 and an input/output expander 24. For example, the CPU may be a PDP 11/34 from Digital Equipment Corporation. A common line printer 25 and video display CRT 26 is associated with the central computer 10. As will be described more fully in FIG. 2, the central computer 10 is connected to each test stations 12 and 14 by a separate bus which is an IEEE-488 general purpose interface bus.

Each test station 12 and 14 is a mirror image of the other and contains independent sets of stimulus and measurement equipment. Generally, each include a video terminal display keyboard 30 and a test station control panel 32. By using independent sets of stimulus and measurement equipment, the problems common to measurement multiplexing is avoided. Also, as will be explained more fully below, the use of impedance matched coaxial cables and a unique grounding system further aides the isolation and noise immunity.

Direct current stimulus and measurement capability is provided by eight programmable power supplies PPS 1 through PPS 8, power supply programmer 34 and digital multimeter 36. The programmable power supplies PPS 1 through PPS 8 may be, for example, SYSTRON-DONNER Model PQ 20-2. These programmable power supplies each have constant voltage and constant current operation and can either be locally or remotely programmed. This allows for distributive programming which minimizes the amount of time the central computer 10 is used.

The power supply programmers 34 may be SYSTRON-DONNER Programmer Model P-2 which interfaces with the IEEE 488 general purpose interface bus and is designed to control up to four independent programmable power supplies. The power supply programmer 34 is capable of receiving a address with separate subaddresses to conserve the number of IEEE general purpose interface bus addresses by controlling up to four devices simultaneously as to the output voltage, output current and voltage limits. The supply programmer has a capability of recognizing input program commands which will change any or all the parameters in any order. Also, any or all of the programmable power supplies connected to the supply programmer can be simultaneously commanded to a zero output voltage and then, with a single command, resort to their previous or a different programmed value.

The digital multimeter 36 may be a Hewlard Packard Model 3455A which is a microprocessor controlled digital integrating voltmeter to measure D.C. voltages, A.C. voltage and resistance. This model has an automatic calibration feature which automatically corrects for gain and offset error in the analog circuitry. This unit also has math features capable of calculating offsets, taking ratios and providing readings in physical constants.

The AC stimulus and measurement section uses four programmable pulse generators PPG A–PPG D and wave analyzer 38. The programmable pulse generator PPG A may be an E-H International Model 1560 and the programmable pulse generators PPG B, C, D may be slave models 1564 by E-H. The programmable pulse generator PPG A includes a built-in micro-processor which may receive inputs locally or remotely by the IEEE bus from the central computer 10. Each of the slave units PPG B, C and D have identical pulse capabilities without the microprocessor. As with the programmable power sources, this allows distributive programming. The waveform analyzer 38 may be, for example, E-H International Model 060, dual-channel digital waveform analyzer. The waveform analyzer is capable of displaying on a CRT 39 analog waveforms, digital read-outs and store program information. The waveform analyzer includes a microprocessor and may be controlled locally or remotely via the IEEE 488 bus. This also allows distributive programming. Associated with the waveform analyzer 38 is a probe multiplexer 40 which may be an E-H Model 1011 which is designed to extend the two channel capability of the waveform analyzer to up to twenty channels.

Each station also includes a multi-programmer 42 which may be a Hewlard Packard Multi-Programmer Model 6942A. The multi-programmer 42 is a microprocessor controlled instrument used to control the A.C. matrix, the D.C. matrix and the relay drivers in the test head. This particular model is programmable only through the IEEE 488 bus. The multi-programmer 42 includes four precision current forcing digital-to-analog converters. As will be explained more fully below, the multi-programmer 42 reads and stores the station number, the test head fixture number and the test head serial number for use by the host processor.

Figure 2:
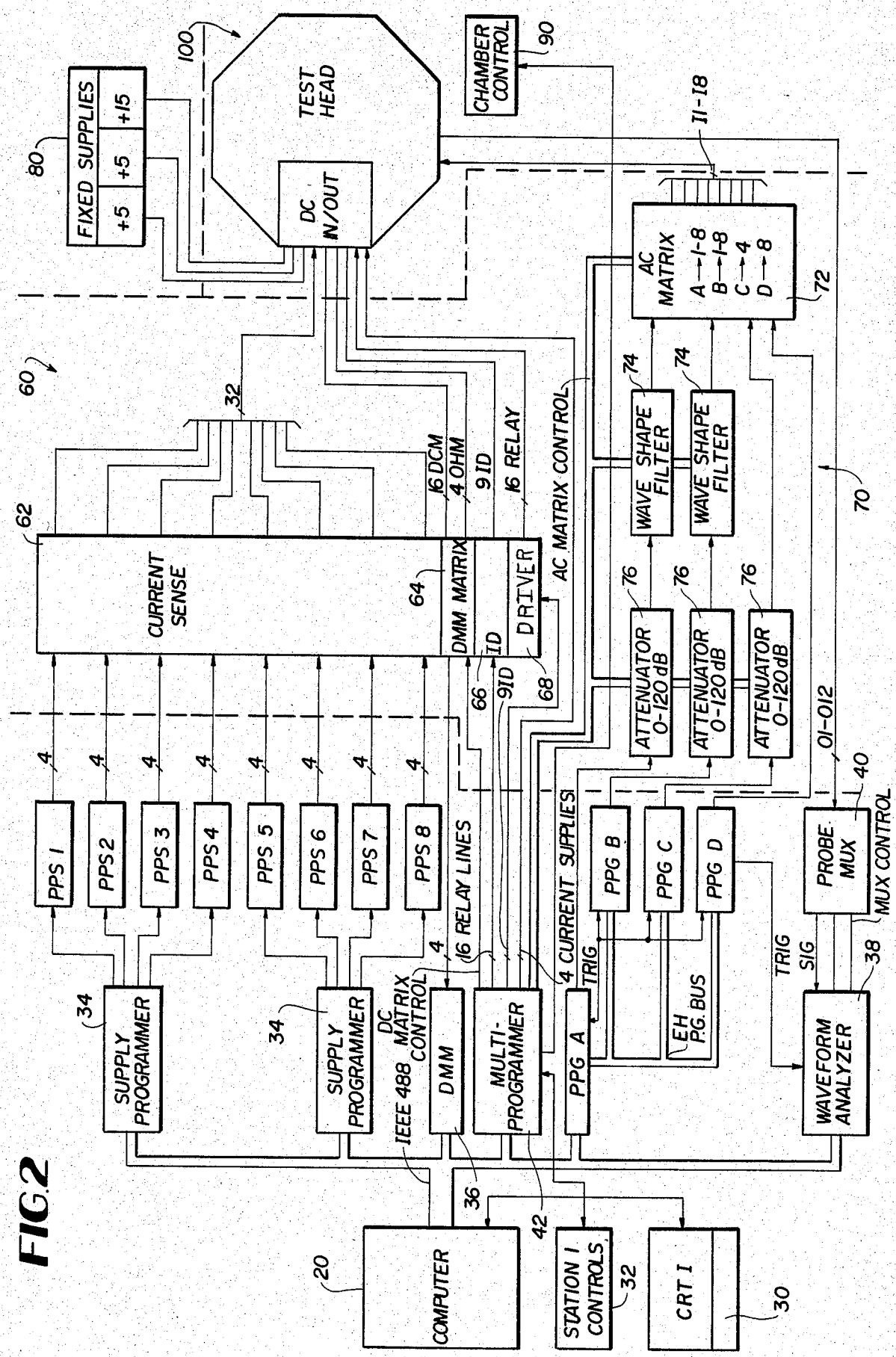
FIG. 2 is a block diagram of a single station of the pulsed linear integrated circuit tester incorporating the principles of the present invention.

The elements described so far for the test station 12 are commercially available components and are racked together and signify in FIG. 2 as sections 50. Each test site 55 includes a D.C interface section 60, a A.C. interface section 70, fixed D.C. power supplies 80, a temperature forcing system 90, and test head 100. As will be explained in more detail below, the test head 100 is electrically and electromagnetically isolated from the A.C. interface section 70 which is in the same cabinet as the test head 100 whereas the D.C. interface 60 and the fixed D.C. power supplies are on the back of the racked section 50.

The temperature forcing system 90 may be, for example, Thermonics Model T-2050 unit which controls the temperature of the environment of the device under test. The Thermonics unit controls a stream of dry gas or dry liquid nitrogen at a desired feed rate and forces the nitrogen at a desired temperature over the device under test at the test head 100. This specific Thermonics model will control the stream of nitrogen within plus or minus 1° C. over a range of −60° to +150° C. For temperature setting above room temperature, the nitrogen is heated to the desired temperature electrically and then forced into the test site through a controlled pressure regulator. Once a test site reaches the desired temperature setting, the controller will pulse the heater as required to keep the temperature with the plus or minus 1° C. tolerance. For temperature setting below room temperature, liquid nitrogen is used. The liquid nitrogen is passed through a vaporizer and then enters the air heater. This allows the liquid nitrogen to be converted to nitrogen that is extremely cold and the air heating system will raise the nitrogen temperature to the desired setting level.

The D.C. interface segments 60 include a current sensing section 62, digital multi-meter matrix 64, an identification section 66, relay drivers 68 and appropriate controls. The current sensing section 62 interconnects the thirty two lines from the eight programmable pulse source PPS 1-8 to the test head 100.

Figure 3:
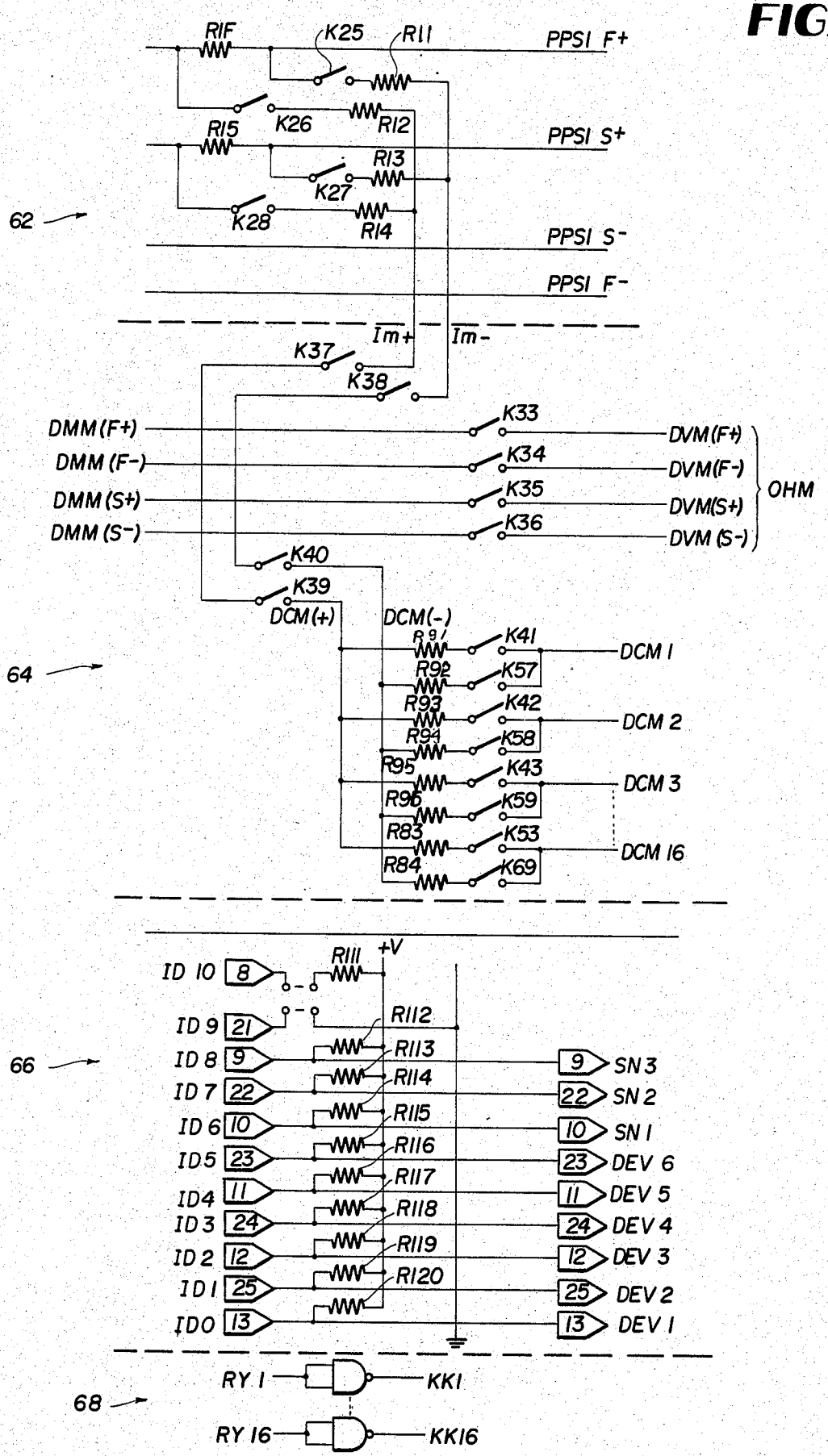
FIG. 3 is a schematic diagram of the D.C. interface of the present invention.

For each pulse source there is a plus and minus sense line PPS S+ and PPS S− and a plus and minus force line PPS F+ and PPS F−. Also included in the current sensing section 62, as illustrated in FIG. 3, are resistors and relays to sense the current on the force plus line PPS F+ and the sense plus line PPS S+. As illustrated specifically for the programmable pulse source PPS 1, a measurement resistor R1F is provided in the plus force line and a pair of relay contacts K25 and K26 connect each side of the resistor R1F to a common current line IM+ and IM− through isolation resistors R11 and R12, respectively. The plus sense line PPS1 S+ also includes a measurement resistor R1S connected to the IM+ and IM− line by relay contact K27 and K28 and isolation resistors R13 and R14. A decoder receiving signals from the multi-programmer 42 activates the appropriate line of a preselected pulse source, namely, the force line F+ or the sense line S+ and connects it to the current measurement common lines IM+ and IM−. The other two lines, namely, the negative sense line S− and the negative force line F− currents are not sensed. A pair of relay contacts K37 and K38 connect the positive/negative current measurement lines IM+ and IM− to the digital multimeter plus and minus force lines DMM F+ and DMM F−, respectively. A decoder upon receiving signals from the multi-programmer 42 selects the current measuring mode as the signals to be connected to the digital multimeter force lines. It should be noted that although a one group of four lines from a programmable pulse source is illustrated in sections 62 in FIG. 3, this pattern is repeated for all eight programmable pulse sources with the plus force line and the plus sense line being connected to the common current measurement lines IM+ and IM−, respectively.

Also connected to the digital multimeter output lines DMM F+, DMM F−, DMM S+ and DMM S− are the four ohm or resistance measuring lines from the test head 100 illustrated as inputs DVM F+, DVM S−, DVM S+ and DVM S−. Relay contacts K33, K34, K35 and K36 interconnect the four ohm output lines from the test head to the output lines to the digital volt meter. A decoder is provided to select the resistance measuring mode to close the relay contacts K33, K34, K35 and K36.

The D.C. matrix section 64 also includes interconnections for the sixteen D.C. measurement lines DCM 1 through DCM 16 from the test head 100. Each of the inputs is connected to a common output line DCM+ and DCM— through a relay contact and a resistor. As illustrated specifically, DCM 1 is connected to the DCM+ line by resistor R91 and relay contact K41 and to the DCM— line by resistor R92 and relay K57. The common output lines DCM+ and DCM— are connected to the inputs of the digital multimeter forcing lines DMM F+ and DMM F—, respectively, through relay contacts K39 and K40. The decoder closes these contact switches in response to a D.C. voltage measurement mode and connects the selected D.C. measurement contact to the digital multimeter.

The ID section 66 of the D.C. interface includes nine inputs from the test head 100, three of which are the serial number of the test head and six numbers representing the fixture number of the test head. These inputs are provided to the multi-programmer as inputs ID0 through ID8. The station number is provided as inputs to the multi-programmer as ID9 and ID10. This is selected by appropriately connecting the resistor R11 to either ID10 or ID9 with the other one being connected directly to ground. This allows distinction between the two test stations.

The D.C. interface 60 also includes the relay drive sections 68. The input from the multi-programmers RY1 through RY16 are provided to NAND gates whose outputs are the control signals for relays at the test site KK1 through KK16, respectively.

While the output from the rack section 50 are provided through the D.C. interface 60 directly to the test head 100, for example, the programmable pulse sources PPS of section 62 and the relay driver's section 68 and while the ID output from the test head 100 is provided directly to the multi-programmer 42 through section 66, the inputs to the digital multimeter 36 are selectively provided as either the current measurement IM, the resistance measurement DVM from the test head or selective D.C. voltage measurements DCM under the control of control signals from the multi-programmer 42. The mode selected for the connection to the digital multimeter as well as which input of the selected mode is performed by decoders.

Figure 4:
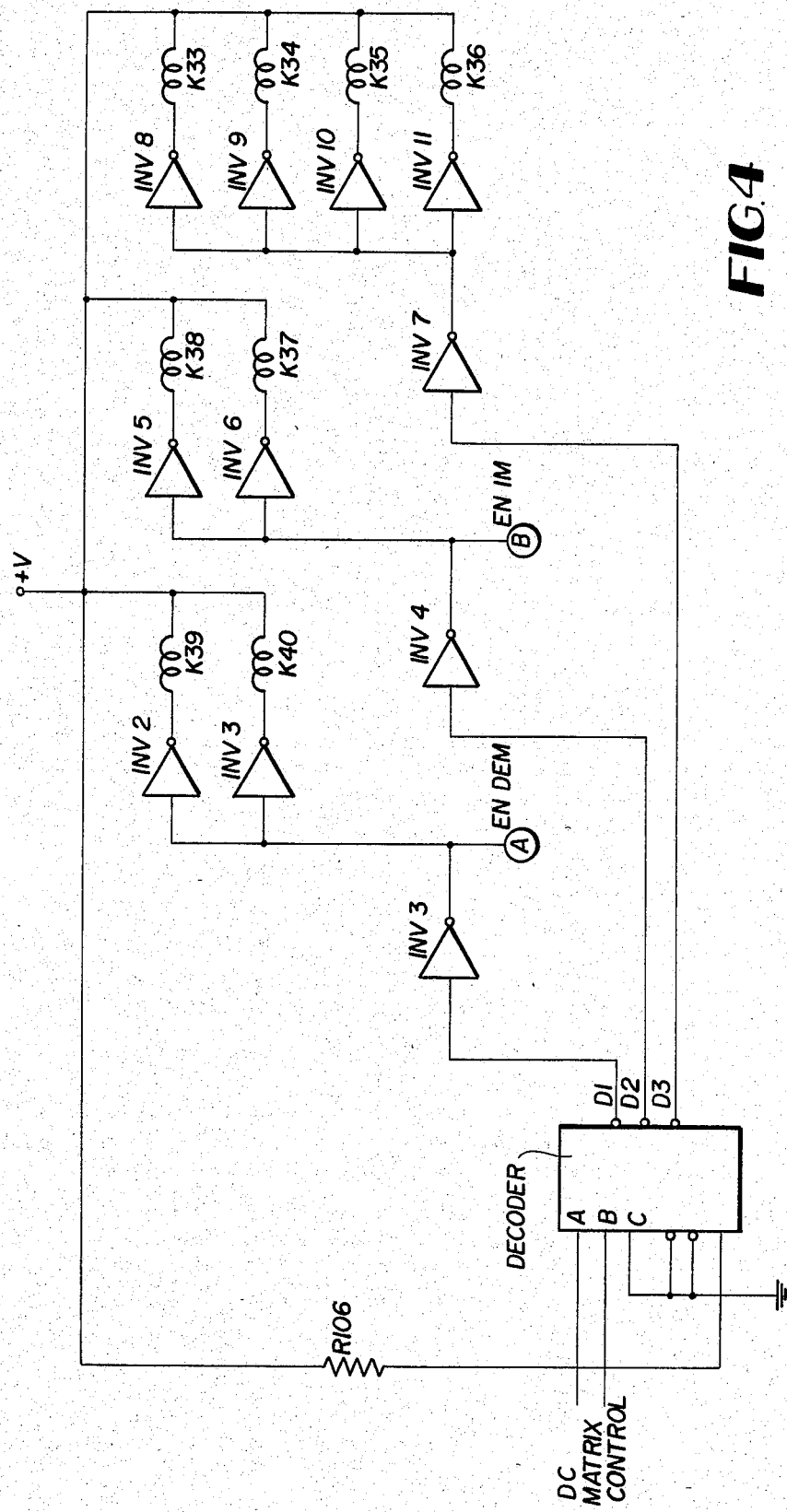
FIG. 4 is a schematic diagram of the D.C. matrix control of the present invention.
Figure 5:
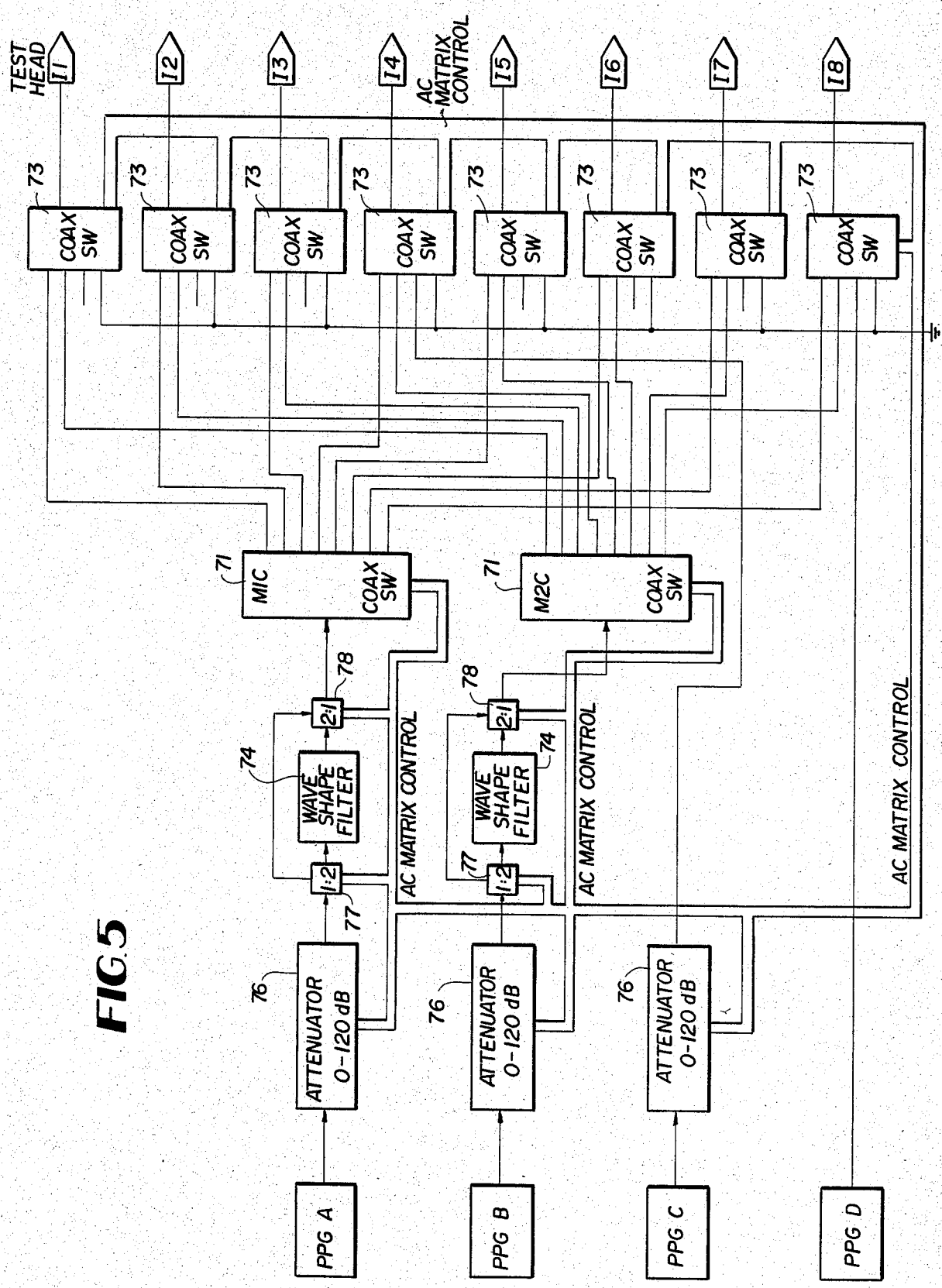
FIG. 5 is a block diagram of the A.C. interface of the present invention.

A typical decoder is illustrated in FIG. 4 for the mode selection of the relays K33 through K40. Decoding network includes a decoder having a pair of inputs from the multi-programmer 42 and provides three selective outputs to specific relays. The first output D1 is provided through inverter INV1 and inverters INV2 and INV3 to relays K39 and K40. This selects the D.C. voltage measurement mode and closes switches K39 and K40. The second output D2 is provided through inverters INV4, INV5 and INV6 to relays K37, K38 to select the current measurement input and closes switches K37 and K38 to connect the output of the programmable pulse sources. The third output is provided through inverters INV7 through INV11 to activate relays K33 through K36 to close their respective contacts so as the ohm measurement can be taken. The first output D1 is also provided from the ouput inverter INV1 to the decoder section of the digital volt meter section as DC measurement enable EN DCM. Similarly, the second output D2 is provided through inverter INV4 as enable input for the current measurement section as signal EN IM.

The decoders to select the appropriate programmable pulse source to be measured or one of the sixteen D.C. measurement points from the test head have equivalent decoder circuits including a decoder and a plurality of relays to activate the contacts illustrated in FIG. 3. Since it is well known in the art, further descriptions will not be provided of each of the specific decoders.

The A.C. interface section 70 includes an A.C. matrix 72, wave shaped filters 74 and programmable attenuators 76. The interface also performs functions of selectively attenuating incoming pulse signals, and selecting wave shaping of the incoming signals.

The output of the programmable pulse generator PPGA enters the A.C. matrix and goes through a software programmable attenuator 76. This attenuator as well as the other two attenuators is programmable in ten DB steps with a range of 0 to 120 DBs. The signal from the attenuator then goes to a 1 to 2 coaxial bypass switch 77 that allows the user to choose the gaussian wave shape network 74 or bypass this wave shape filter entirely. If the wave shape filter 74 is chosen, the output will produce sinusoidal signal from the pulse train that is programmed into the programmable pulse generator. The output of either the wave shape filter 74 or the bypass switch 77 is then sent to a 2 to 1 coaxial bypass switch 78 that provides a single signal path to the A.C. matrix.

The output of this 2 to 1 switch 78 is then sent to a 1 out of 8 coaxial switch 71 that allows the programmable pulse generator PPGA to go to any, all or any combination of the eight inputs to the test head. The eight outputs of the 1 to 8 coaxial switch 72 are provided to eight separate 4 to 1 coaxial switches 73 which selects one of its four inputs to be provided to a coaxial cable to the coaxial connector located on the test fixture.

The output of the programmable generator PPGB operates exactly the same manner as that for PPGA in that the pulses are provided through a programmable attenuator 76, a 1 to 2 coaxial bypass switch 77, a wave shape filter 74, a 2 to 1 coaxial switch 78, a 1 to 8 coaxial switch 71 and eight 4 to 1 coaxial switches 73. The signals from the programmable pulse generator PPGC are transmitted through a programmable attenuator 76 and connected directly to the fourth 4 to 1 coaxial switch 73. This allows the signal from PPGC to go only to the fourth A.C. input on the test head. The output from the programmable pulse generator PPGD goes directly to the eighth 4 to 1 coaxial switch 73 without any attenuation or wave shaping. This allows the signal of PPGD to go only to the eighth A.C. input of the test head.

As illustrated in FIG. 2, the twelve A.C. outputs from the test head 100 are provided through probe multiplexer 40 and waveform analyzer 38 back to the central computer 20. The waveform analyzer 38 provides the control signals for the probe multiplexer 40.

Figure 6:
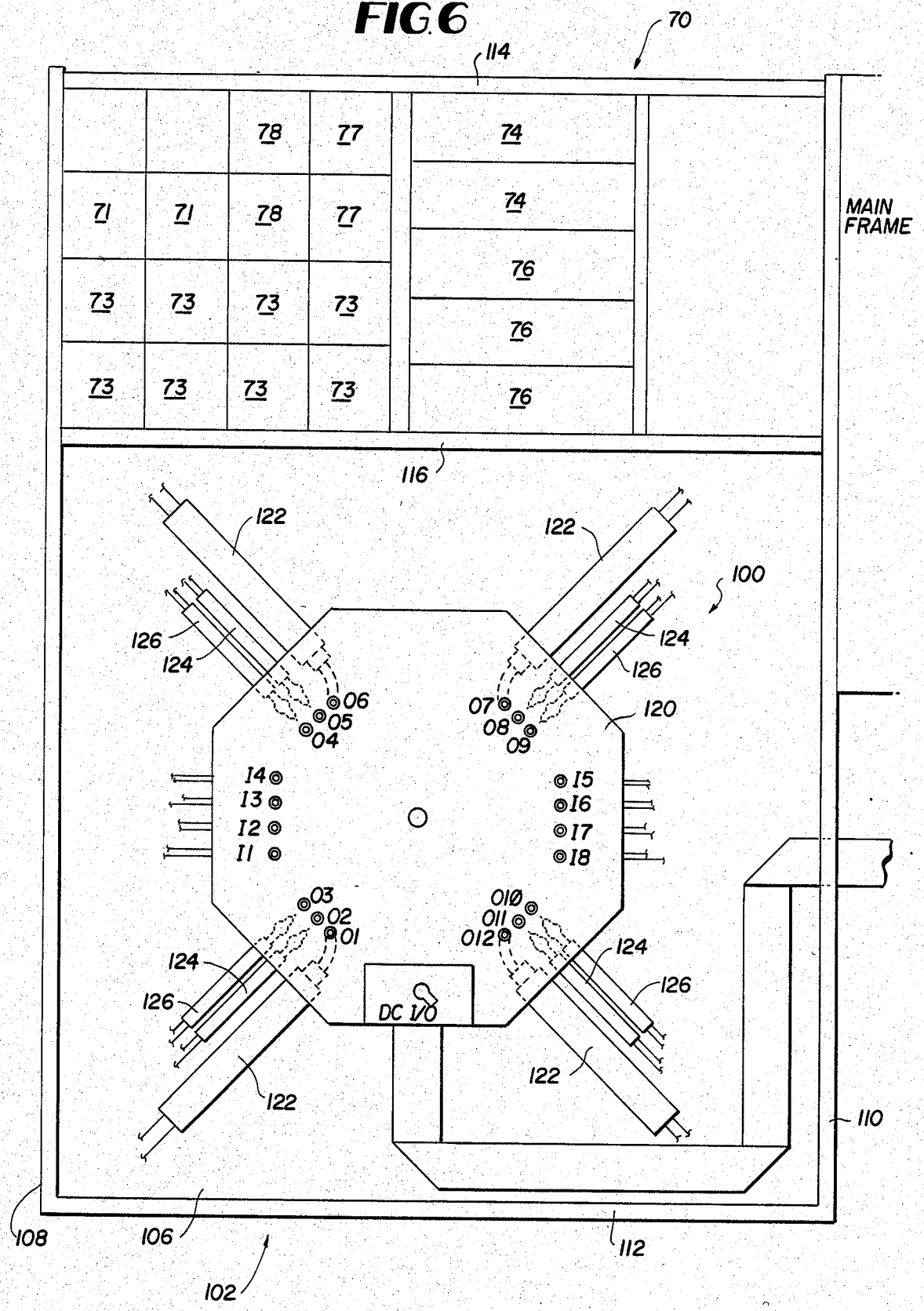
FIG. 6 is a plan view of the test head and A.C. interface incorporating the principles of the present invention.

The test site as illustrated in detail in FIG. 6 includes a cabinet 102 which forms an electromagnetically shielded enclosure and includes the test head 100 and the A.C. matrix 70. The cabinet 102 includes a top 104 which is shown removed in FIG. 6, a bottom 106, side walls 108 and 110, front wall 112, back wall 114 and interior wall 116 dividing the test head 100 from the A.C. interface 70. As illustrated, the A.C. interface 70 includes the coaxial switches 71 and 73, the wave shape filter 74, the programmable attenuator 76, the 1 to 2 coaxial bypass switch 77 and the 2 to 1 coaxial bypass switch 78.

The test head 100 is illustrated in FIG. 6 as including a mother board 120 which is made of electrical magnetic shield material and has twelve A.C. output terminals 01 through 012 and eight A.C. input terminals I1 through I8 and a D.C. input/output receptacle D.C. I/O. The A.C. input and output terminals are spaced around the periphery of the mother board 120. A.C. probes 122, 124 and 126 are connected to the output terminals 01 through 03, 04 through 06, 07 through 09 and 010 through 012, respectively. A.C. probe 120 has a selection between times 1, times 10 and times 100 attenuation, probe 124 is a times 1 attenuator and 126 is a times 10 attenuator. The A.C. probes 122, 124 and 126 are connected to the A.C. matrix as well as the input terminals I1 through I8 by equal length coaxial cables shown therein. The D.C. input/output receptacle DCI/O is connected by a ribbon cable to the D.C. interface 60. This maximizes the impedance match between the A.C. matrix and the mother board 120.

Figure 7:
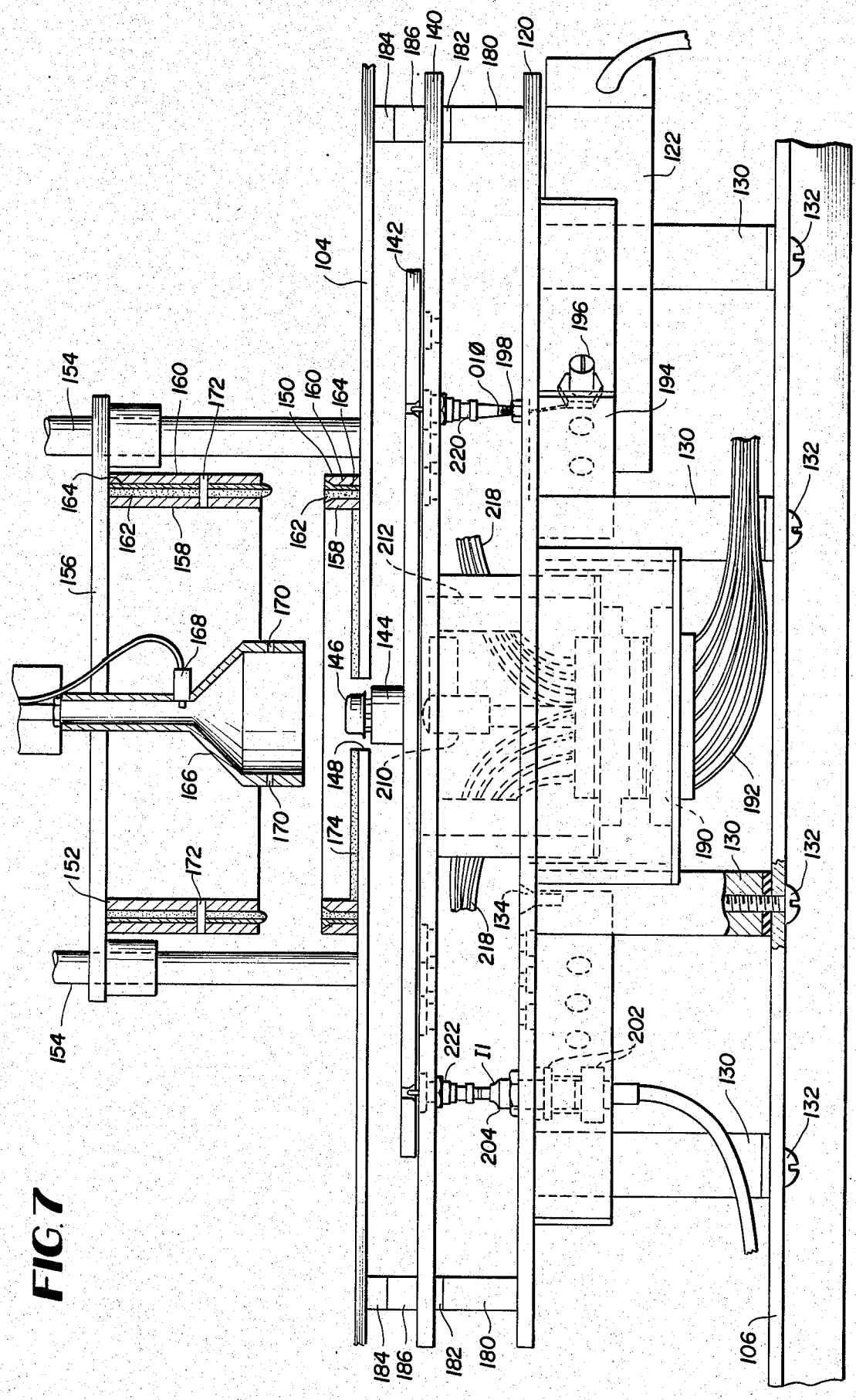
FIG. 7 is a side cutaway view of a test head incorporating the principles of the present invention.

As illustrated in FIG. 7, the mother board 120 is maintained above the bottom wall 106 of the housing by a plurality of legs 130. The legs are secured to the bottom wall by screws 132 and the mother board by recess screws 134. Since the legs of the mother board and the housing as well as the screws are metallic, the mother board and the housing are isolated by insulators on the legs 130. Ground continuity path is provided via instrument ground, namely, the A.C. matrix and waveform analyzer.

Also, within the cabinet 102, is a load board 140 made of electromagnetic shield material and has a printed circuit board 142 thereon. The printed circuit board, an example of which is shown in FIG. 9, is specifically designed for a unique device under test. A device under test receptacle 144 provided on the printed circuit board 140 with a specific device under test 146 positioned thereon. The top of the housing 104 includes an opening 148 therein to allow the device under test 146 to be inserted into the device under test receptacle 144 without opening the top 104.

Mounted to the top 104 exterior to the cabinet 102 is a collar 150. Above the collar is a hood 152 which is slidably mounted to a pair of rails 154 which are secured to the exterior of the top 104. The collar 150 and the hood 152 are multi-layered structures including an aluminum top 156, interior and exterior plastic walls 158 and 160, interior thermal insulative layer 162 and an electromagnetic and grounding copper layer 164. Also secured to the hood 152 is a cap 166 which surrounds the device under test 146 and the aperture 148 when the hood 152 is lowered into a place in engagement with collar 160. The cap 166 is connected to the chamber temperature control 90 and includes a temperature sensor 168. The cap 166 includes vents 170 and hood 152 includes a plurality of vents 172 to prevent pressure build-up by the temperaturing foreign system. A rubber gasket 174 is positioned on the portion of the top 104 interior to the collar 160. This provides thermal insulation of the environmental chamber formed by the collar 160 and hood 152 from the electronics beneath the top 104.

As will be explained more fully below in reference to FIGS. 7 and 8, the device under test basically is enclosed in the thermal forcing environment and is electromagnetically isolated from the connectors and wires of the printed circuit board 142, the load board 140 and the mother board 120. As illustrated in FIG. 8, a line 176 provides dry nitrogen within the interior of the cabinet 102 to reduce a non-condensing atmosphere which would otherwise change the capacitance of the cabinet chamber and affect the input and output signals. Vents 178 are provided in the cabinet 102 so as to not allow the dry nitrogen to exit through aperture 148 and the top of the housing.

The connectors between the mother board 120 and the load board 140 are enclosed by a flange of preferably aluminum 180 extending up from the mother board 120 and a gasket mounted to the bottom of the load board 140. Similarly, the volume between the load board 140 and the top 104 is surrounded by an aluminum ring 184 mounted to the bottom surface of the top 104 and a gasket 186 mounted to the top of the load board 140. The rings 180, 182, 184 and 186 help isolate the connectors and the elements between the mother board 120, the load board 140, the printed circuit board 142 and the device under test receptacle 144 from the environment of the cabinet 102. As will be evident from the following description below, all the connectors from the A.C. and D.C. interface circuits are made below the mother board 120 so as to isolate the device under test 146 from such connections since the mother board 120 is an electromagnetic shield plate. Also, the connections between the mother board 120 and the load board are electrically isolated from the device under test 144 since the load board 140 is also made of electromagnetic shield plate.

One of the main features of the present invention is that by mounting the thermal environment system to the top 104 and allowing access to the device under test through the opening 148, the movement of the temperature system is onto and off of the top plate 104 of the cabinet and not the printed circuit board 142 to which the device under test is mounted through a device under test receptacle 144. Similarly, the top 104 is supported by the load board 140 via rings 184 and 186 and, again, the printed circuit board 142 is not placed under any stress or strain of mechanical load of the system. This greatly extends the life of the testing system as well as removes one of the major sources of possible degregation of test equipment.

Mounted to the mother board 120 is a J99 D.C. input/output D.C. receptacle 190 having the ribbon cable 192 connected thereto, The J99 has eighty eight connectors possible. All of the D.C. inputs are parts from the interface 60, and the D.C. power sources 80. Also mounted below the mother board 190 are four flanges 194 each having three coaxial connectors 196 therein to receive the three A.C. probes 122, 124 and 126. A single such connector 196 is illustrated in phantom. The coaxial connector 196 is connected to a surface A.C. probe terminal 198 on the surface of the mother board 120. This is illustrated as output terminal 010. As illustrated in FIG. 8, the attenuators are secured and held in place to the mother board 128 by fasteners 200. Also mounted underneath the board 120 are eight A.C. input connectors 202 which provide an A.C. input terminal 204 on the top of the mother board 120. This is illustrated in FIG. 7 for the input I1 and FIG. 8 for the inputs I5, I6 and I7. It should be noted that various elements have been deleted from FIG. 7 for sake of clarity.

The mother board 120 is permanently in place and provides the D.C. receptacle 190, the twelve A.C. output terminals 01 through 012 and eight A.C. input terminals I1 through I8. The load board 140 is removably positioned on the top of the mother board 120 and held in place by a zero insertion connector 210 which is in the D.C. plug 212 which is received in the D.C. receptacle 190. A pin 214 on the load board 140, illustrated in FIG. 8, is diagonally opposed the D.C. plug 210 and is received in an aperture 216 in the mother board 120. This allows proper alignment of the load board 140 and the mother board 120.

Interconnecting the D.C. input and output portions of the printed circuit board and the D.C. plug 212 are a plurality of wires 218. Extending down from the bottom of the mother board 140 are a plurality of A.C. probe terminals 220 and A.C. input terminals 222 which are received by and mate with the A.C. probe terminals 198 and input terminals 204 extending above the mother board 120. The A.C. probe and input terminals are plugged into each other when the load board 140 is positioned on the mother board 120. This particular structure allows easy and quick mounting of a new load board 140 with a specially designed printed circuit board 142 thereon to the permanently installed mother board 120.

The printed circuit board illustrated in FIG. 9 may include relays thereon as well as various capacitors and impedances which may be added or deleted from specific input and output lines to change the input/output characteristics of the signals provided to the device under test. The relays are under the control of the relay driver section 68 of the D.C. interface 60. It should be noted that these relays are not being switched during a specific test and, therefore, their switching will not introduce undesirable electromechanical noise within the cabinet 102.

The general test sequence begins with the insertion of a load board 140 into the mother board 120. The computer checks to see if the correct test fixture is installed by reading the wired code on the test fixture. The computer begins by placing a "go remote" command on the IEEE bus to cause the instruments to listen for further instructions. The program will then initialize all instrument on the bus to preprogram those which have large storage registers such as the waveform analyzer and the programmable pulse generators. Then the computer checks to see if the correct test fixture is installed by reading the wired code on the test fixture. This is followed by the general test sequence which includes:

(1) Setting the D.C. supplies to their required values;
(2) Setting the fixture relays to their proper pattern;
(3) Patterning and routing the programmable pulse supplies;
(4) Programming and routing the D.C. matrix;
(5) Programming and routing the waveform analyzer 38 and the probed multiplexer 40;
(6) Measuring supply currents using the current sense hardware 62 and the D.C. matrix 66 or trigger the waveform analyzer 38; and
(7) Testing the measured value limits and setting passer fail flag.

Table I has a sample program of a D.C. amplifier test program.

As is evident from the above detailed description of the preferred embodiments, that the objects of the invention are attained in that an improved pulse linear integrated circuit tester is provided. Although the invention has been illustrated and described in detail it is clearly understood that the same is by way of illustration and example only and is not to be taken by way of limitation. The spirit and scope of the present invention are to be limited only by the terms of the appended claims.

TABLE I

| Code | Comment |
|---|---|
| COM (LOGCOM) VALUES(600), UNITS% (600), SPARES% (240) | ! Set up common area for datalog purposes |
| COM LOGNUM, DIGNUM%, OFFSETL, OFFSETS, DLOG% | ! Define the control variables for datalog |
| LOGNUM=0  DIGNUM%=3% | ! Initialize the datalog file, #significant figures (3%+1) |
| CALL REMOTE | ! Set the instruments to REMOTE status on the bus |
| CALL LOGSET | ! Initialize the datalog control variables |
| ***** THE SECTION FROM 900 TO 1999 IS SKIPPED AFTER THE FIRST RUN ***** | |
| CALL READEF BY REF (95%, SKIP%)  IF SKIP%=2% THEN 2000 | ! Check the first pass flag (95), skip if not first pass (95=2%) |
| IF SKIP > 2% THEN CALL ERROR (2%) | ! If (95) is greater than 2%, then this is an error condition |
| CALL IDHEAD (STATNUM$, FIXNUM$ SERNUM$) | ! This reads the fixture number, fixture serial number, and fixture station |
| IF FIXNUM$ ='03' THEN 930 | ! The correct fixture has a 03 coded on J99 as FIXTURE TYPE |
| CALL ERROR (1%) FATALERROR%=1% | ! If fixnum$ wasn't '03', then an error is flagged |
| FIXNUM$='SPB 00536' | ! This translates FIXNUM into the assigned fixture number |
| CALL INIT | ! Initialize ALL instruments (takes 6 seconds) |
| FINAL SETUP FOR RUN | |
| IF FATALERROR%=1% THEN PRINT 'WRONG FIXTURE' | ! If wrong fixture, quit without setting bin, this lights ERROR light |
| ICC TEST | |
| CALL SRELAY('2') | ! Set relay line KK2 to a '1' condition |
| CALL SVTPPS (15,15,0,0,0,0,0) | ! Set supplies 1 and 2 to 15 volts, the rest to remain at zero |
| CALL SETDVM('DC','AUTO', 'NHR','NAC') | ! Set the DVM to autorange DC, no high resolution, no autocal |
| UNIT$='MA' | ! Define UNIT$ for datalog purposes |
| CALL MESPSI(1%,ICC) | ! Power supply current measure, supply #1, value is ICC in mA |
| IF (ICC<20.0) OR (ICC >30.0) THEN BAD, FAIL=1 | ! Test ICC to limits, set FAIL and BAD if test fails |
| CALL DLOG(ICC,UNIT$, FAIL) | ! Datalog results, clear FAIL (FAIL=0) if datalogging |
| IF FAIL > 0 THEN 31000 | ! If unit fails and FAIL is not cleared, then end program |
| IEE TEST | |
| CALL MESPSI(2%,IEE) | ! Measure current on power supply #2, value is IEE in mA |
| IF (IEE<25.0) or (IEE >38.0) THEN BAD, FAIL=2 | ! Test IEE to limits, set BAD and FAIL if test fails |
| CALL DLOG (IEE,UNIT$,FAIL) | ! Datalog results, clear FAIL if datalogging |
| IF FAIL > 0 THEN 31000 | ! If unit fails and Fail is not cleared, then end program |
| DC GAIN TEST | |
| CALL SRELAY("5") | ! Set relay lines KK1 and KK3 to "1", clear others |
| CALL DCMCON(1,16) | ! Connect DVM to lines DCM1 and DCM16 |
| UNIT$=' ' | ! Set UNIT$ to two blanks (no units) |
| GOSUB 10000 | ! Go to the measurement |

TABLE I-continued

| | |
|---|---|
| | subprogram which begins at 10000 |
| IF FAIL > 0 THEN 31000 | ! If unit fails when not datalogging, end program |
| CALL DCMCON(2,16) | ! Connect DVM to lines DCM2 and DCM16 |
| GOSUB 10000 | |
| IF FAIL > 0 THEN 31000 | |
| CALL DCMCON(3,16) | ! Connect DVM to lines DCM3 and DCM16 |
| GOSUB 10000 | |
| IF FAIL > 0 THEN 31000 | |
| CALL DCMCON(4,16) | ! Connect DVM to lines DCM4 and DCM16 |
| GOSUB 10000 | |
| IF FAIL > 0 THEN 31000 | |
| CALL DCMDET | ! Disconnect all DCM lines from the DVM |
| CALL SRELAY("0") | ! Set all relay lines to "0" state |
| GOTO 31000 | ! End of program, go to FINISH UP routine |
| CALL VLTPPS(3%,0) | ! Set power supply #3 to 0 volts |
| CALL MESDVM(V.0) | ! Trigger a DVM measurement, value returned in V.0 |
| CALL VLTPPS(3%,0.3) | ! Set power supply #3 to 0.3 volts |
| CALL MESDVM(V.3) | ! Trigger a DVM measurement, value returned in V.3 |
| GAIN=(V.3−V.0)/.3 | ! Calculate gain using the previous measurements |
| IF GAIN (GAIN<31.83) OR (GAIN>35.18) THEN BAD, FAIL=3 | ! Test GAIN to limits, set BAD and FAIL if test fails |
| CALL DLOG(GAIN,UNIT$,FAIL) | ! Datalog results, clear FAIL if logging |
| RETURN | ! RETURN to first statement after last GOSUB executed |
| FINISH UP | |
| Pass/Fail flags set! | |
| IF BAD > 0 THEN CALL REJECT | ! If at any time a test failed, BAD was forced above zero |
| IF BAD=0 THEN CALL PASS | ! If no test failed, then BAD was left at zero |
| CALL ZERO | ! Clear all matrices, set all supplies to zero |
| PRINT"; | ! Prints a "BEEP" to signal the end of the program |
| CALL LOCAL | ! Set all instruments on the GPIB to the local state |
| END | ! Program terminator |

What is claimed is:

1. An integrated circuit tester comprising:
a test cabinet means having a bottom, side and top walls, for forming an electromagnetic shielded enclosure, said top wall includes an aperture;
test board means mounted in said cabinet means for interconnecting electrical signals between a device under test and a control unit;
a device receptacle means extending up from said test board means and positioned in said aperture in said top wall;
hood means exterior said test cabinet for enclosing a device under test in said device receptacle means when said hood means is lowered to engage said top wall and forming an electromagnetic shielded and thermal enclosure about said device under test; and
thermal means in said hood means for controlling the temperature of said device under test.

2. An integrated circuit tester according to claim 1, wherein said thermal means includes a cap secured to said hood means and movable therewith to enclose said device under test when lowered to engage said top wall.

3. An integrated circuit tester according to claim 2, wherein said cap includes a port for receiving a fluid which determines the temperature of said device under test.

4. An integrated circuit tester according to claim 3, wherein said cap includes a vent to the interior of said hood means and said hood means includes a vent to atmosphere.

5. An integrated circuit tester according to claim 1, wherein said top wall includes a collar encompassing said aperture and forming an electromagnetic and thermal barrier and said hood means engages the top edge of said collar when lowered.

6. An integrated circuit tester according to claim 5, wherein the portion of said top wall of said cabinet encompassed by said collar includes thermal insulation.

7. An integrated circuit tester according to claim 1, wherein said hood means includes walls having a layer of thermal insulation and a layer of conductive metal which is an electromagnetic shield.

8. An integrated circuit tester according to claim 7, wherein said conductive metal of said hood means and said cabinet means are grounded.

9. An integrated circuit tester according to claim 7, wherein said conductive metal of said hood means is copper and said cabinet means is aluminum.

10. An integrated circuit tester according to claim 1 including rail means extending up from said top wall of said cabinet means, said hood means slides up and down on said rail means.

11. An integrated circuit tester according to claim 10, wherein said hood means is electrically connected to said cabinet means through said rail means, and said cabinet means is grounded.

12. An integrated circuit tester according to claim 1, including a gas port in said cabinet means for filing said cabinet means with a gas to create a dry atmosphere in said cabinet means.

13. An integrated circuit tester according to claim 12, including a vent in said cabinet means to prevent a pressure build-up of said gas in said cabinet means.

* * * * *